United States Patent [19]

Miyawaki et al.

[11] Patent Number: 5,563,824
[45] Date of Patent: Oct. 8, 1996

[54] NONVOLATILE SEMICONDUCTOR MEMORY DEVICE AND METHOD OF ERASING STORED DATA THEREOF

[75] Inventors: Yoshikazu Miyawaki; Takeshi Nakayama; Masaaki Mihara; Shinji Kawai; Minoru Ohkawa, all of Hyogo, Japan

[73] Assignee: Mitsubishi Denki Kabushiki Kaisha, Tokyo, Japan

[21] Appl. No.: 357,697

[22] Filed: Dec. 16, 1994

[30] Foreign Application Priority Data

Dec. 27, 1993 [JP] Japan .................. 5-331717

[51] Int. Cl.⁶ .................................................. G11C 11/34
[52] U.S. Cl. ................. 365/185.18; 365/185.01; 365/189.11; 365/185.29
[58] Field of Search ................. 365/185.01, 185.18, 365/185.29, 189.11, 185.33

[56] References Cited

U.S. PATENT DOCUMENTS 5,040,147  8/1991  Yoshizawa et al. ............... 365/51 X
5,341,329  8/1994  Takebuchi ......................... 365/185.18
5,388,069  2/1995  Kokubo ............................. 365/185.18

FOREIGN PATENT DOCUMENTS 5-283709  10/1993  Japan.

*Primary Examiner*—David C. Nelms
*Assistant Examiner*—Huan Hoang
*Attorney, Agent, or Firm*—Lowe, Price, LeBlanc & Becker

[57] ABSTRACT

A source line of a memory array included in a flash memory is set to a 3V potential by a source line circuit, a power supply voltage of 6V is applied to a sense amplifier, and 3V is applied as the ground potential. After the setting of such potential conditions, reading of the memory array is performed. When current flows to the memory cells as a result of reading, it means that the memory cell has been erased. If the current does not flows through the memory cell, erasure pulse is applied again and every memory cell is verified.

7 Claims, 16 Drawing Sheets

|  | ERASE | ERASE VERIFY | OVER ERASE VERIFY | PRG AFTER ERASE | READ |
|---|---|---|---|---|---|
| BL(227) | open | 4V(1V) | 4V(1V) | 9V(6V) | 1V |
| WL$_1$(205) | 0V | 5V(2V) | 3V(0V) | 5V(2V) | 3V |
| WL$_2$(205) | 0V | 0V(-3V) | 0V(-3V) | 0V(-3V) | 0V |
| SL(235) | 9V | 3V(0V) | 3V(0V) | 3V(0V) | 0V |

FIG.15 PRIOR ART
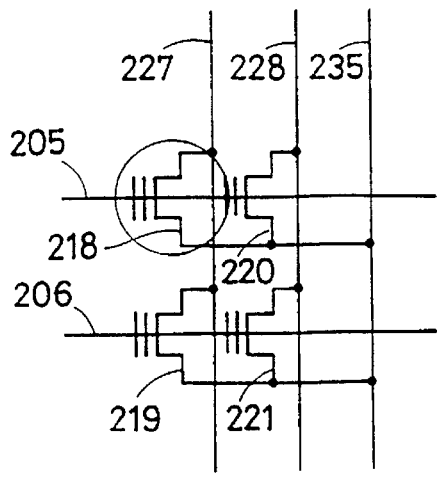
FIG.16 PRIOR ART
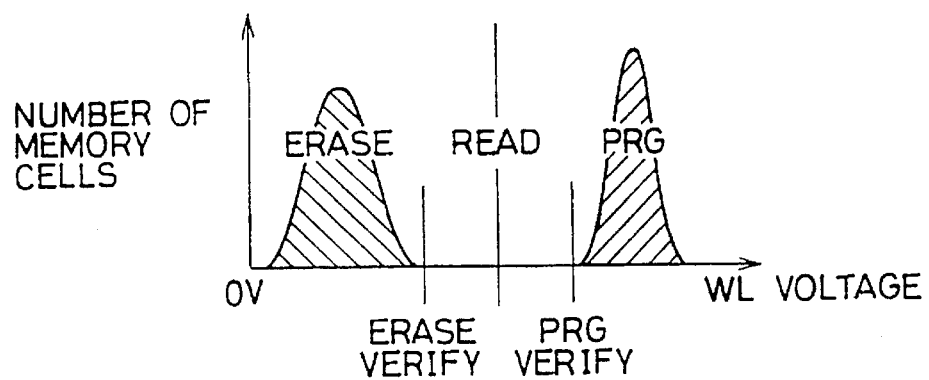
FIG.17 PRIOR ART
|  | PRG | ERASE | ERASE VERIFY | READ | PRG VERIFY |
|---|---|---|---|---|---|
| BL (227) | 6V | open | 1V | 1V | 1V |
| WL (205) | 10V | 0V | 3.5V | 5V | 6.5V |
| SL (235) | 0V | 9V | 0V | 0V | 0V |

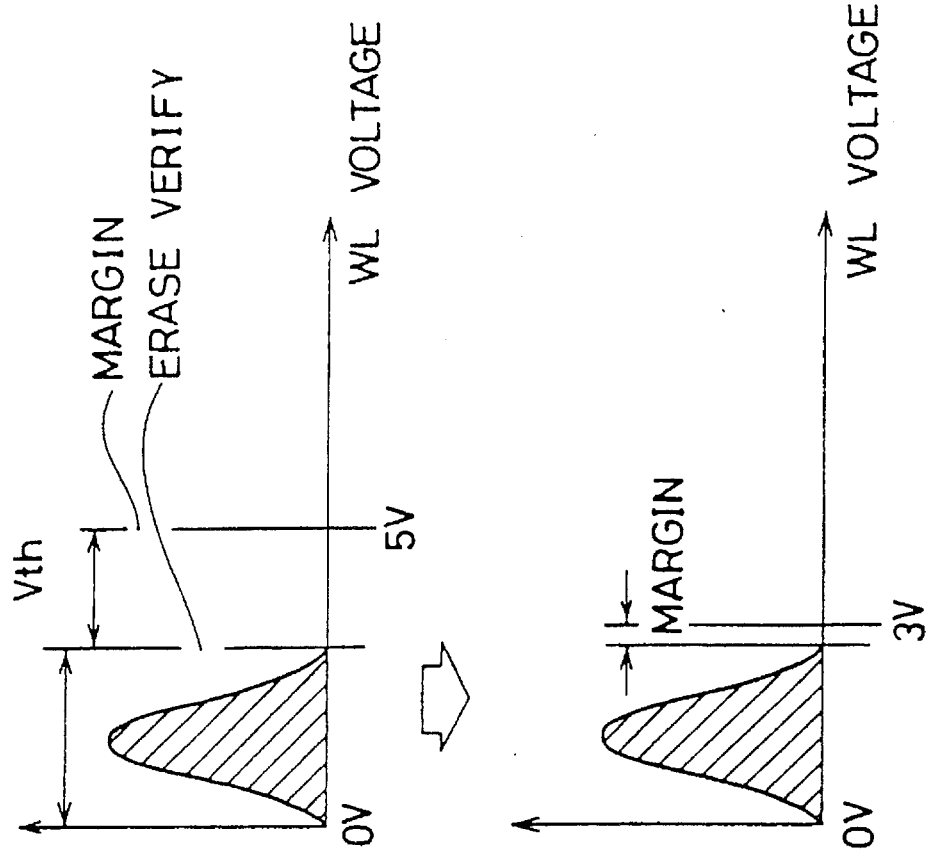
FIG. 25 (a) PRIOR ART
FIG. 25 (b) PRIOR ART

NONVOLATILE SEMICONDUCTOR MEMORY DEVICE AND METHOD OF ERASING STORED DATA THEREOF

BACKGROUND OF THE INVENTION

1. Field of the Invention

The present invention relates to a nonvolatile semiconductor memory device and to a method of erasing stored data. More specifically, the present invention relates to a nonvolatile semiconductor memory device such as a flash memory, and to an improved method of erasing stored data.

2. Description of the Background Art

FIG. 13 is a block diagram showing the whole structure of a flash memory as one example of a conventional nonvolatile memory. Referring to FIG. 13, a data input/output terminal 27 is used for input of information to be stored, and for providing stored information from the inside. In case of a flash memory, this terminal is also used for inputting commands. A command is an instruction input to the chip when an operation is to be effected on the chip. The chip determines internal operation in accordance with the command, and performs internal address generation, internal voltage control and so on, for writing or erasing information.

Data input to data input terminal 27 is latched by a data latch 3 through an input buffer 1. The latched information is input to program circuit 17 as a WD signal, and applied to a bit line connected to an arbitrary memory cell in a memory array 19 through a Y gate 9. WD signal is further applied to a command decoder 24 and a data comparator 23.

The information ("0"/"1") read from memory array 19 is read by sense amplifier 16 through Y gate 9, and provided as an RD signal to data terminal 27 through an output buffer 2. The Y gate 9 for selecting an arbitrary bit line is selected by an Y address signal. Namely, the Y address signal is input to Y address buffer 4, predecoded by Y predecoders 5 and 6, and further decoded by Y decoder 7. Thus any of the Y gates selected through Y driver 8 is turned on.

An arbitrary word line is selected by an X address signal. The X address signal is input to X address buffer 10, predecoded by X predecoders 11, 12 and 13, and further decoded by an X decoder 14. Thus the word line selected through word driver 15 is raised to the "H" level.

In a flash memory, it is necessary to set the selected bit line to a high voltage, and the selected word line to the high voltage also during writing operation, as will be described in detail later. Y driver 8 and word driver 15 have the function of converting the power supply voltage to a high voltage. An erasing circuit 18 controls source line potential of memory array 19. Erasing circuit 18 is controlled by an internal control signal such that a high voltage is applied to the source line of the memory array 19 in erasing operation, and the source line of memory array 19 is grounded in reading and writing operations.

ACE buffer 20 is a buffer of an external control signal for activating the flash memory, a $\overline{WE}$ buffer 21 is a buffer for an external control signal for controlling command input mentioned above, and an $\overline{OE}$ buffer 22 is a buffer for an external control signal controlling an output buffer 2 for externally reading the data. A voltage control circuit 26 is for converting an externally applied high voltage to another high voltage required in a device.

Writing and erasing operations are performed in accordance with flow charts shown in FIGS. 23 and 24 which will be described later, while performing internal address generation, voltage control and so on. Such control is performed by a sequencer 25 receiving, as inputs, signals from a command decoder 24. Sequencer 25 includes an address generator, an operation control circuit, a pulse application number counter and so on. Details of these components are not given, since they are not directly related to the present invention.

FIG. 14 shows a specific structure of the Y gate and the memory array shown in FIG. 13. FIG. 15 shows memory cells of FIG. 14 extracted, FIG. 16 shows reading, programming and erasing potentials, and FIG. 17 also show the potentials in a table.

Referring to FIGS. 13 to 17, memory array structure, voltage conditions for writing and erasing operations and principle of operation of the memory cell will be briefly described. FIG. 14 shows memory array 19 including 32 bits of memory cells. Drains of the memory cells are connected to bit lines 227 to 234, respectively. Of the bit lines 227 to 230 of I/O1 and bit lines 231 to 234 of I/O0, only one arbitrary bit line is connected to sense amplifier 16 and program circuit 17 for every I/O, in accordance with signals 201 to 204 from Y gate 9 (obtained by decoding Y address signal). Control gates of the memory cells are connected to word lines 205 to 209, respectively, and of the word lines 205 to 209, an arbitrary word line is selected in accordance with the X address signal.

When a Y gate line 201 shown in FIG. 14 is selected, Y gates 210 and 214 are selected, and bit lines 227 and 231 are connected to the corresponding sense amplifier 16 and program circuit 17. These sense amplifiers 16 and program circuits 17 operate simultaneously. Though 2 bits constitute a word in the example shown in FIG. 14, generally one word is constituted by 8 bits/16 bits. Therefore 8 sets or 16 sets of such structure are provided. A source line 235 of the memory cells is commonly connected to the source of all the memory cells, and connected to erasing circuit 18.

FIG. 15 shows memory cells 218, 219, 220 and 221 extracted from FIG. 14. Referring to FIG. 15, the principal of respective operations of the memory cells will be described. Here, description will be given with respect to memory cell 218. FIG. 17 collectively shows voltage conditions for respective operations. In the writing operation high voltage of about 6 V is applied to bit line 227, a high voltage of about 10 V is applied to word line 205, and source line 235 is grounded. Under such voltage condition, a large current flows between the drain (bit line) and the source (source line) of the memory cell, resulting in generation of hot electrons near the drain of the memory cell. The hot electron has high energy, and further, dependent on the potential at the control gate (word line), electrons are injected to the floating gate with a certain probability. Then, the threshold voltage of the memory cell viewed from the control gate shifts to a higher value by the amount of charges of the moved (injected) electrons. The electrons once injected to the floating gate are maintained in the normal state, as the floating gate is electrically insulated.

In the erasing operation, the source line is set to a high voltage of about 9 V, the word line is grounded, and the bit line is set to a floating state. Then, a high electric field is applied between the source-control gate of the memory cell, electrons are drawn out from the floating gate because of tunnelling, and as a result, the threshold voltage viewed from the control gate lowers by the amount of extracted charges. In this manner, by applying a high voltage to the source line 235, electric field is generated in every memory cell of memory cell array 19, and thus all memory cells are erased simultaneously.

Hatched portions of FIG. 16 represent the threshold voltage of the memory cell viewed from the control gate in the writing/erasing operations, taking into consideration variations in the memory array. Here, it should be noted that the threshold voltage of the memory cell in the erase state is not lower than 0 V. A memory cell having the threshold voltage lower than 0 V (depletion) is referred to as an "over erased bit", and causes disadvantages which will be described below.

In the reading operation, a bias potential of about 1 V is applied to the bit line, a reading potential of about 5 V is applied to the word line, and the source line 235 is grounded. Referring to FIG. 16, when a memory cell to which writing has been effected is read, current does not flow even when a potential (1 V) is applied to the drain (bit line), since the threshold voltage of the memory cell is higher than the reading potential (word line potential). When a memory cell to which erasure has been effected is read, current flows between the drain and the source when a potential (1 V) is applied to the drain (bit line), since the threshold voltage of the memory cell is lower than the reading potential (word line potential). Whether the current flows or not is sensed by sense amplifier 16, and thus information is read.

In this manner, since whether a current flows through the memory cell or not is detected, when there is an over erased bit having depleted threshold voltage, current flows through the over erased memory cell, and hence information cannot be correctly read.

Referring to FIG. 17, erase verify (ERS VERIFY) and write verify (PGM VERIFY) represent reading operations for verifying sufficient shift of the threshold in respective operations. In write verify, the word line potential is set higher than the normal reading potential so as to let the current flow easier, and the content of the memory cell is read. In erase verify, the word line potential is set lower than the normal reading potential so as to suppress current flow, and the content of the memory cell is read. By such reading operations, there are provided margins with respect to the normal reading operation, as indicated by erase verify and program verify in FIG. 16.

FIG. 18 shows a path from an input of the X address signal to selection of a word line. In reading and writing operations, it is necessary to externally provide an address signal, and therefore an CTRL-AG signal of X address buffer 10 is set to the "H" level. In response to the CTRL-AG signal, in X address buffer 10, a complementary signal of the address signal is generated and provided to X predecoder 11. In erasing operation, when an operation called "write before erasure", that is, writing operation to every memory cell, is to be performed, an address is generated by internal sequencer 25, the CTRL-AG signal attains to the "L", and the external signal is cut and switched to an internal signal intA.

Address signals are divided into several groups, and predecoding is performed group by group. X predecoder 11 is a circuit for activating (setting to the "H" level in FIG. 18) only one of the output signals PR10 to 13 selected by the input address. Namely, one signal is always selected in response to an arbitrary address input. In the erasure operation, it is necessary that all word lines (control gates) are grounded (non-selected state). Therefore, a predecoder inactivating signal CTRL-$\overline{\text{ERS}}$ is input to X predecoders 11 to 13. When the CTRL-$\overline{\text{ERS}}$ signal is at the "H" level, predecoding is effected. When it is at the "L" level, all outputs PR10 to 13 are inactivated ("L" level) regardless of the address signal. In this manner, signals PR10 to 13, PR20 to 23 and PR30 to 37 predecoded by X predecoders 11, 12 and 13 are input to X decoder 14. Here, X predecoder 12 does not have the function of inactivation, and the circuit structure as the decoder is the same as that of X predecoder 11.

X decoder 14 receives predecode signals PR10 to 13, PR20 to 23 and PR30 to 37 as inputs, and activates (set to the "L" level) an arbitrary output signal. At this time, when signals are all inactive in any of the predecode signal groups (PG10 to 13, PR20 to 23 and PR30 to 37 constitute three groups), the output signal is not activated by X decoder 14 (erasing operation).

In response to the last selected output signal, word driver 13 activates the word line. At this time, when the power supply VPWL of word driver 15 is at the power supply voltage Vcc, word lines WL0 to WLn rise to the power supply voltage, and when VPWL is higher than the power supply voltage, word lines WL0 to WLn rise to that potential. Namely, in the writing operation, the power supply VPWL is set at about 10 V, and the selected word line rises to the level of 10 V. It goes without saying that at this time, the non-selected word lines are at the ground potential.

As to the path for selecting Y gate 9, the circuit structure is the same except that the word line of FIG. 18 is replaced by a Y gate line.

FIG. 19 shows a circuit structure of a write circuit, an erase circuit, Y gate and part of the memory array. Referring to FIG. 19, writing operation at the bit line will be briefly described, as well as the erasing operation. A signal WD input from input buffer 1 is applied to write circuit 17. In the writing operation, the VPBL power supply is set at a high voltage so that the bit line has the potential of 6 V, and control signal CTRL-PGM is set to the "H" level. By this setting, the sense amplifier 16, which is the reading circuit, is separated, and program circuit 17 is connected to Y gate 9. Control signal CRTL-$\overline{\text{ERS}}$ is set to "H" level, and the source of the memory cell is grounded. When the WD signal is at "L" level, 6 V is applied to the selected bit line, and when the WD signal is at the "H" level, the selected bit line is kept grounded. In this manner, since the bit line potential can be set by the input data (WD), an arbitrary data from "00h (h indicates hexadecimal notation)" to "FFh" can be written (in case a word is constituted by 8 bits). In order to avoid a high voltage remaining on the bit line after the end of writing, the CTRL-BLRST signal is controlled such that a bit line is set to the ground potential after writing operation.

In the erasing operation, the CTRL-$\overline{\text{ERS}}$ signal is set to the "L" level, and the potential set by the power supply VPSL is applied to the source line of memory array 19. Further, it is necessary to set the bit line to the floating state. This can be done by inactivating (setting to the "L" level) all the Y gate lines. Therefore, utilizing the inactivating function mentioned above, all the Y gates are inactivated by Y predecoders 5 and 6 of the Y address.

FIG. 20 is a schematic diagram showing the Y gate, the memory array and the sense amplifier, and FIG. 21 shows characteristics of nodes 602 and 603 of the sense amplifier shown in FIG. 20.

Referring to FIGS. 19 to 21, reading operation at the bit line will be described. When CTRL-$\overline{\text{PGM}}$ signal is set to the "H" level, program circuit 17 is separated from Y gate 9, and when CTRL-$\overline{\text{SE}}$ signal is set to "L", sense amplifier 16 is activated. The characteristic of the node 603 with respect to the node 602 of a p channel load type inverter formed by transistors 604 and 605 is as shown by A of in FIG. 21. The characteristic of the node 602 with respect to the node 603 of the source follower circuit formed by transistors 607, 608 and 609 as well as the memory cell is as shown by B of FIG. 21. In FIG. 21, there are two lines indicated by the character B, which correspond to the programmed state and erased state of the memory cell. The input 602 of the inverter is the output on the side of the source follower, and the output 603 of the inverter is the input to the side of the source follower, and therefore they can be plotted on the same graph. Further, cross points of characteristic curves A and B represent operational points, indicating the potentials at respective nodes. As can be seen from the graph of FIG. 21, the potential at node 602 is almost determined by the logic threshold voltage on the side of the inverter, and the value hardly fluctuates. The potential of node 602 is connected to the bit line through Y gate 9. Therefore, by setting this potential at about 1 V, the bias potential of the bit line is set to 1 V. In this state, when there is no current flowing through the bit line, the node 601 is gradually charged as shown by the curve of node 601 at the programmed state, while in the erased state in which current flows to the bit line, the node 601 is discharged almost to the bit line potential. This change is amplified by the logic gate at the output stage of sense amplifier 16, and transmitted as output signal RD, to output buffer 2.

FIG. 23 is a flow chart showing the writing operation utilizing the above described various operations, and FIG. 24 is a flow chart showing the erasing operation. In FIGS. 23 and 24, command inputs are not shown.

Referring to FIG. 23, the writing operation will be described. In the writing operation, after a command signal is input, the data input to data input terminal 27 is latched by data latch 3, and in accordance with the data, write pulse is applied to respective bit line. Then, comparison between the written data and the read data is performed by data comparator 23 shown in FIG. 13 so as to execute write verify, and when the data coincide with each other, the operation terminates. If not, write pulse is again applied. The above described writing operation is repeated until the data coincide with each other, that is, until the data pass the verifying operation.

In erasing operation, after command input, data of "00h" is written to all the memory cells which are to be erased. This is a counter measure against over erasure mentioned above. This is to suppress variation of threshold voltages of the memory cells, utilizing the characteristic that the amount of shift of the threshold voltage in writing operation saturates with time. Then, an erasure pulse is applied, and then erase verify is performed. During the erasing operation, an address signal is generated internally, and if the selected address passes the verifying operation, the address is incremented successively, repeating the verifying operation. The operation terminates when the last address is verified. When a non-erased memory cell is found during the verifying operation, erasure pulse is again applied, and the flow returns to the verifying operation. Sequencer 25 performs control of address generation, voltage control, operation branching based on data comparison and so on, in accordance with the flow charts of FIGS. 23 and 24.

FIG. 25 shows relation between the distribution of threshold voltages of the memory cells and the erase verify voltage at the time of erase verify operation. As described above; conventionally, the upper limit of the threshold voltage distribution of the memory cells in the erasing operation is detected by the verifying operation during erasure, as shown in FIG. 25(a). However, the width of distribution cannot be made narrower than the memory cell characteristics (variation of threshold voltages). Therefore, even if the lower limit of the threshold voltage distribution of the memory cells is approximately 0 V, the upper limit inevitably corresponds to the upper limit of variation of the memory cell characteristics. Accordingly, it is possible that there is no read margin at the time of low voltage operation using the power supply voltage of 3 V, for example, as shown in FIG. 25(b).

Therefore, an object of the present invention is to provide a non-volatile semiconductor memory device in which distribution of the threshold voltages of the memory cells at the time of erasure is made narrower so as to allow stable reading even when the power supply voltage is lowered. Briefly stated, the present invention provides a non-volatile semiconductor memory device including: a plurality of memory cells arranged in a matrix of rows and columns, each having a control gate, a floating gate, a source and a drain, for holding information charges at the floating gate; a plurality of bit lines provided corresponding to the rows of the memory cells and connected to the drains of the memory cells of the corresponding row; a plurality of word lines provided corresponding to the rows of the memory cells in a direction crossing the bit lines, and connected to the control gates of the memory cells of the corresponding column; a source line connected to the sources of the memory cells; an erasing circuit for extracting electrons from the floating gate; a write circuit for injecting electrons to the floating gate; and a second reading circuit for applying a positive bias voltage to the source line for reading the charge holding state of the memory cell.

Therefore, in the present invention, by applying a positive bias voltage to the source line, an over erase bit can be temporarily masked and detected.

In a preferred embodiment, the memory device further includes a level shift circuit, which includes a first logic circuit operating at a first power supply voltage and a first ground potential; a second logic circuit operating at a second power supply voltage and a second ground potential; and a capacitor element connecting an output terminal of the first logic circuit with an input terminal of the second logic circuit.

According to another aspect of the present invention, the non-volatile semiconductor memory device includes: a plurality of memory cells arranged in a matrix of rows and columns, each having a control gate, a floating gate, a source and a drain, for holding information charges at the floating gate; a plurality of bit lines provided corresponding to the rows of the memory cells and connected to the drains of the memory cells of the corresponding rows; a plurality of word lines provided corresponding to the rows of the memory cells in a direction crossing the bit lines, and connected to the control gates of the memory cells of the corresponding columns; a source line connected to the sources of the memory cells; an erasing circuit for extracting electrons from the floating gate; a first writing circuit for injecting electrons to the floating gate; a reading circuit for reading charge holding state of the floating gate; and a second writing circuit for applying a positive bias voltage to the source line for writing to the memory cell.

Therefore, in the present invention, since a positive bias voltage is applied to the source line for writing to the memory cell, an over erase bit can be repaired, and the threshold voltage distribution of memory cells at the time of erasure can be narrowed.

In accordance with a still another aspect of the present invention, the non-volatile semiconductor memory device includes: a plurality of memory cells arranged in a matrix of rows and columns, each having a control gate, a floating gate, a source and a drain, for holding information charges at the floating gate; a plurality of bit lines provided corresponding to the rows of the memory cells and connected to the drains of the memory cells of the corresponding rows; a plurality of word lines provided corresponding to the rows of the memory cells in a direction crossing the bit lines, and connected to the control gates of the memory cells of the corresponding columns; a source line connected to the sources of the memory cells; a writing circuit for injecting electrons to the floating gate; a predecode circuit for predecoding an address signal; a decode circuit for selecting an arbitrary word line in accordance with the predecode signal; a reading circuit for reading charge holding state of the floating gate; a logic inverting circuit for inverting the logic of the predecode signal; and an activating circuit for activating the predecode signal regardless of the address signal.

Therefore, in the present invention, since the logic of the predecode signal is inverted and the predecode signal is activated regardless of the address signal, only a part of the memory array can be erased, and hence a smaller erase unit can be set.

According to a still further aspect of the present invention, a method of erasing data in a non-volatile semiconductor memory device including a plurality of memory cells, a plurality of bit lines, a plurality of word lines, a source line, an erasing circuit, a first writing circuit, a first reading circuit, a second reading circuit and a second warning circuit includes a first step of determining, after erasure operation, whether the charges read by the second reading circuit is not larger than a first information charge amount; a second step of determining, after the first step, whether the charges read by the second reading circuit is not larger than a second information charge amount; and a third step of injecting, after the second step, electrons to the memory cell by the second writing circuit, to an amount larger than the second information charge amount.

Therefore, in the present invention, when it is determined that the amount of charges in the memory cell is not larger than the first information charge amount after the erasing operation and then it is determined that the amount of charges in the memory cell is not higher than the second information charge amount, electrons are injected to the memory cell to exceed the second information charge amount, so that the threshold voltage distribution in the erasing operation can be narrowed, the upper limit of distribution can be lowered by the amount of narrowing, and therefore there can be a margin even for the reading with low voltage.

Further, in still another aspect of the present invention, the method of erasing data in a non-volatile semiconductor memory device including a plurality of memory cells, a plurality of bit lines, a plurality of word lines, a source line, an erasing circuit, a first writing circuit, a first reading circuit includes a first step of determining, after erasing operation, whether the charges read by the first reading circuit is not larger than a first information charge amount, and a step of injecting, after the first step, electron to the memory cells by the second writing circuit, to an amount larger than a second information charge amount.

Therefore, in the present invention, if it is determined after erasing operation that the charges in the memory cell is not higher than the second information charge amount, electrons can be injected to the memory cell so that the amount exceeds the second information charge amount.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 15 shows the memory cell extracted from FIG. 14.

FIG. 16 shows reading, programming and erasing potentials.

FIG. 17 shows, in a table, the reading, programming and erasing potentials.

FIG. 25 shows the relation between the distribution of the threshold voltages of the memory cells in the erase verify operation and the erase verify voltage.

DESCRIPTION OF THE PREFERRED EMBODIMENTS

Figure 1:
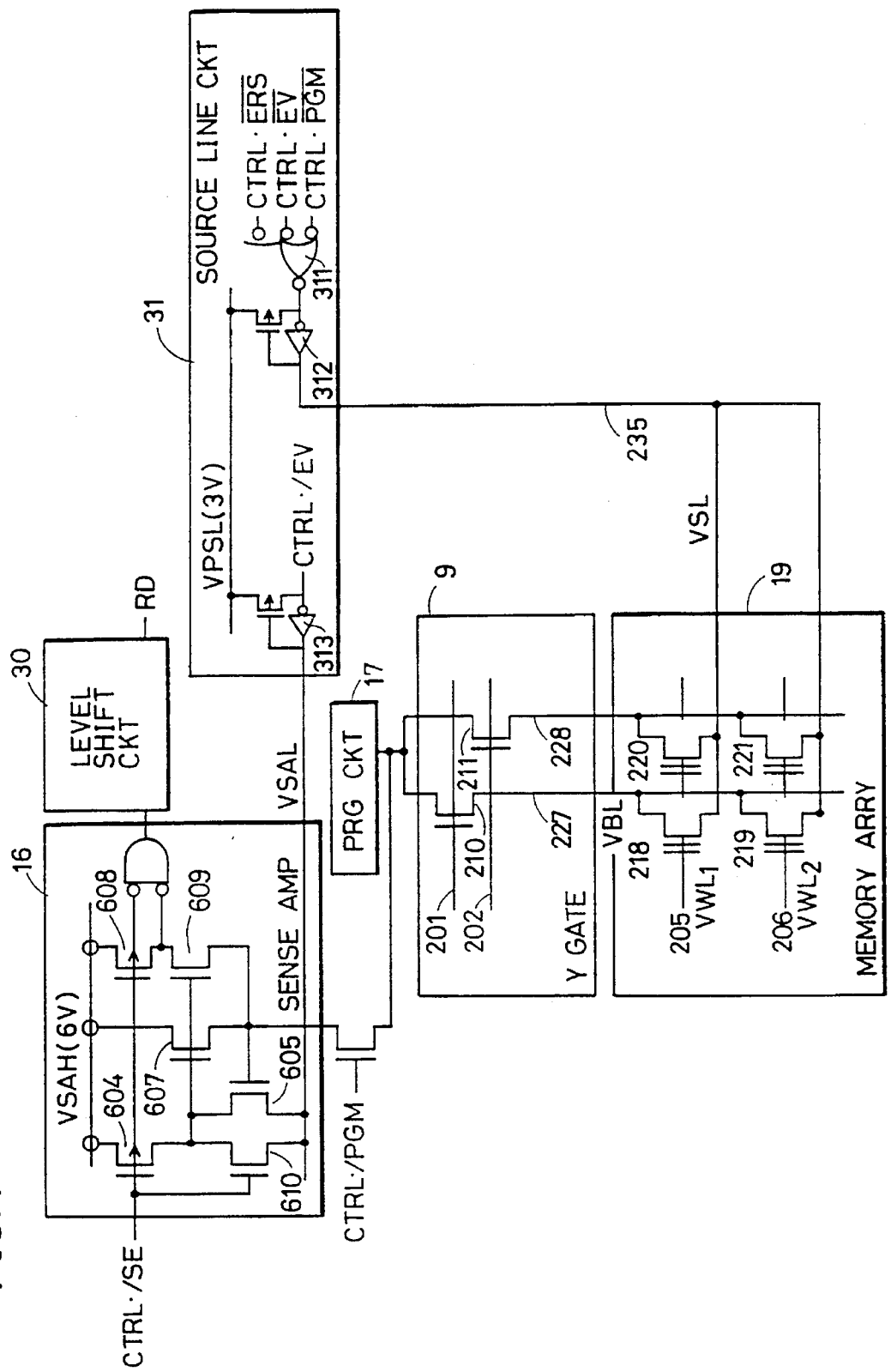
FIG. 1 is a schematic diagram showing main portions of one embodiment of the present invention.

FIG. 1 shows a main portion of one embodiment of the present invention. The embodiment shown in FIG. 1 corresponds to the prior art example shown in FIG. 20, and only the sense amplifier, Y gate and memory array are extracted. The sources of memory cell transistors 218 to 221 have been grounded at the time of writing in the prior art example shown in FIG. 20. However, referring to FIG. 1, in this embodiment, the potential of the VSL node of the source line of memory cell transistors 218 to 221 is set to 3 V, for example. For this purpose, a source line circuit 31 is provided. Source line circuit 31 includes an OR gate 311 and switching circuits 312 and 313. OR gate 311 receives CTRL-$\overline{\text{ERS}}$ signal, CTRL-$\overline{\text{EV}}$ signal and CTRL-$\overline{\text{PGM}}$ signal. When CTRL-$\overline{\text{EV}}$ signal attains to the "L" level, OR gate 311 supplies the potential at the VPSL line, for example 3 V, to VSL node, by means of switching circuit 312.

Figure 20:
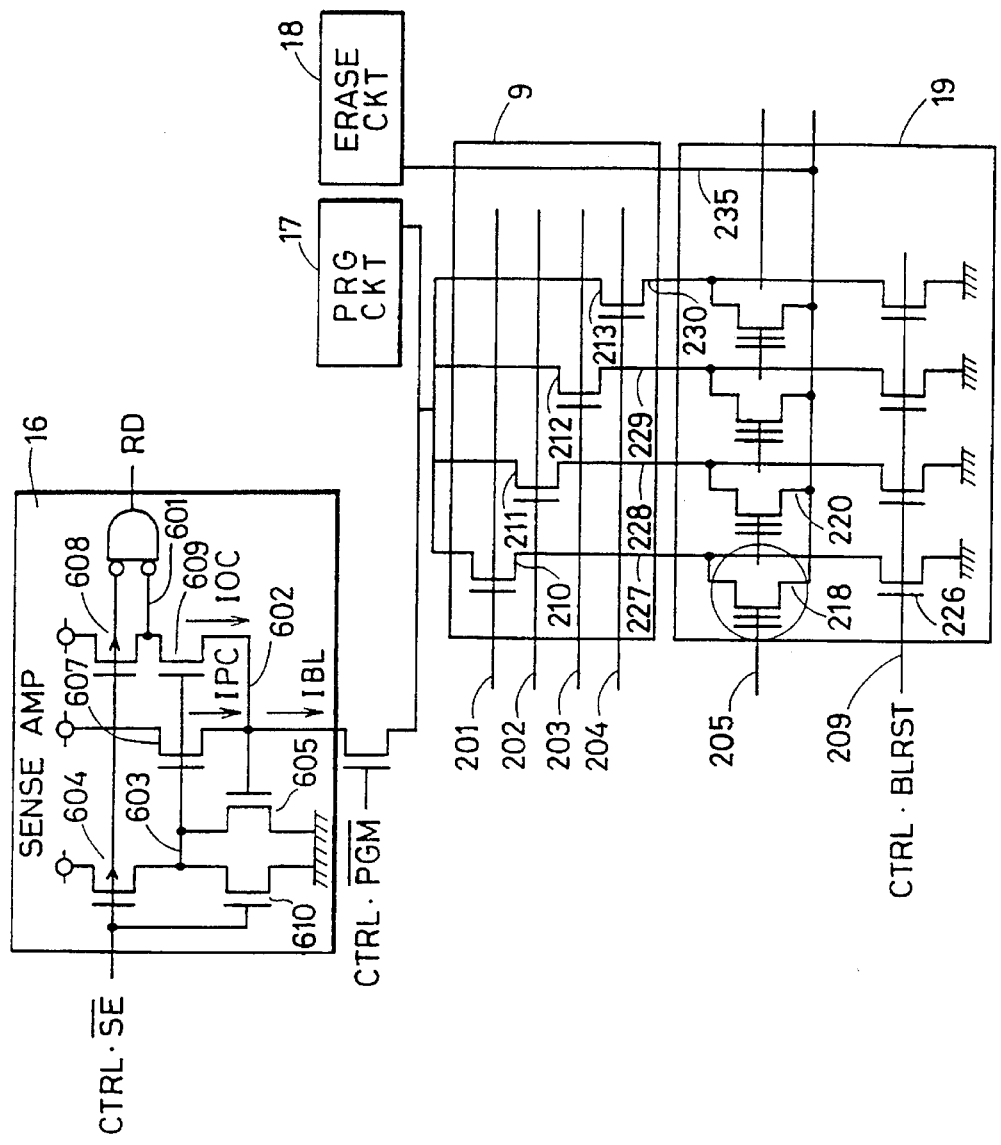
FIG. 20 is a schematic diagram extracting the sense amplifier, the memory array and the Y gate.
Figure 21:
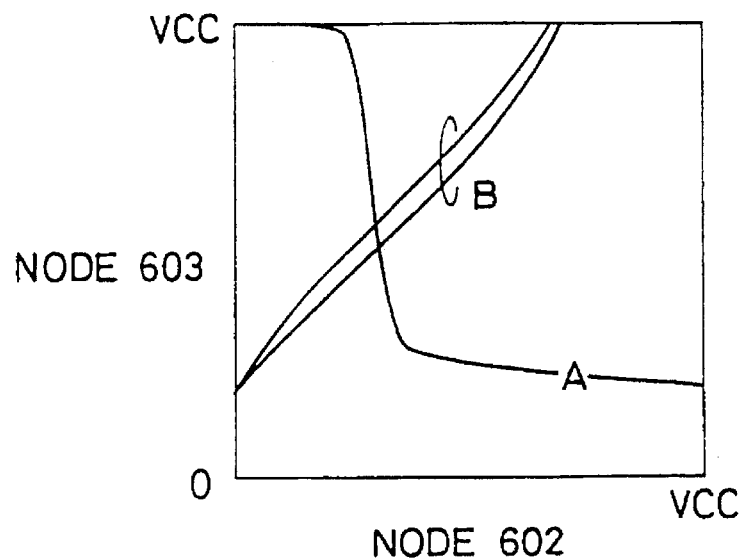
FIG. 21 shows characteristics at nodes 602 and 603 of the sense amplifier shown in FIG. 20.
Figure 22:
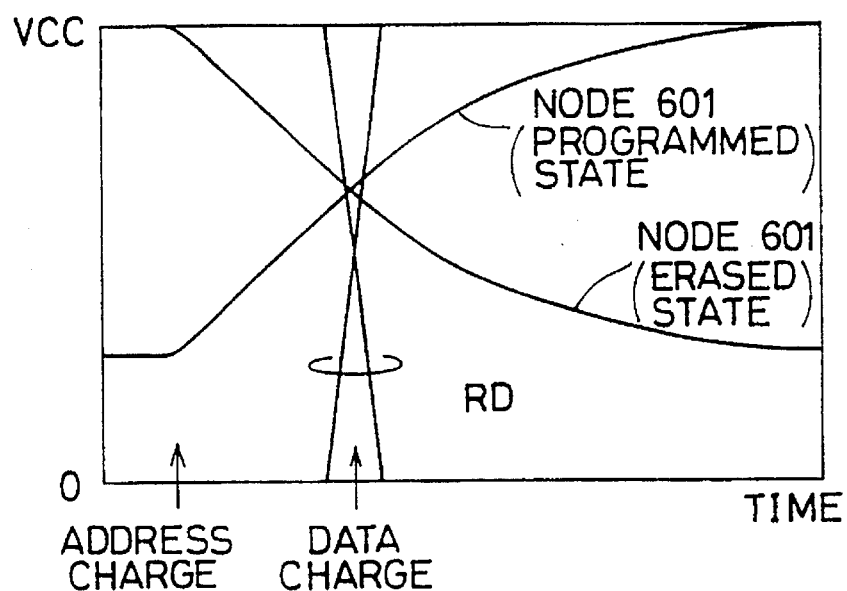
FIG. 22 shows characteristics in the written state and the erased state at node 601 of the sense amplifier shown in FIG. 20.
Figure 23:
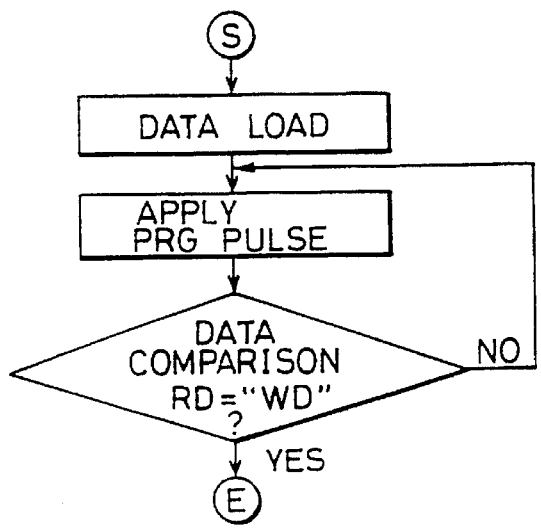
FIG. 23 is a flow chart showing a writing operation.
Figure 24:
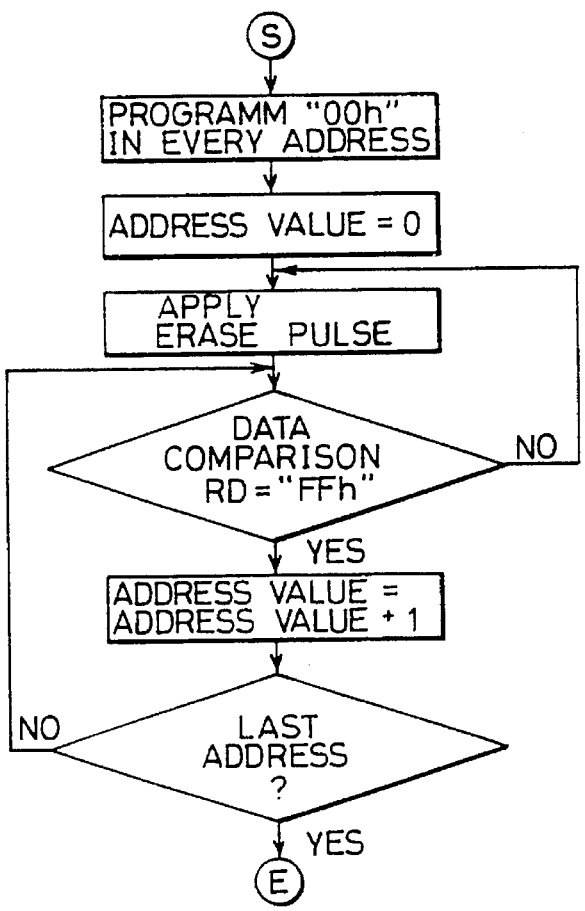
FIG. 24 is a flow chart showing an erasing operation.

In the prior art example of FIG. 20, n channel transistors 605 and 610 included in sense amplifier 16 have been grounded. However, in this embodiment, the potential of 3 V is also applied to the VSAL node, which serves as the sources of n channel transistors 605 and 610. More specifically, when CTRL-$\overline{\text{EV}}$ signal attains to the "L" level, switching circuit 313 supplies the potential of 3 V at VPSL line to VSAL node. A potential of 6 V is supplied to VSAH node of the sense amplifier. Therefore, sense amplifier 16 provides data of which level changes between 3 V and 6 V. In order to shift the potential of the data between 3 V to 6 V to the level of a potential between 0 V to 3 V, a level shift circuit 30 is connected to the output of sense amplifier 16.

Figure 2:
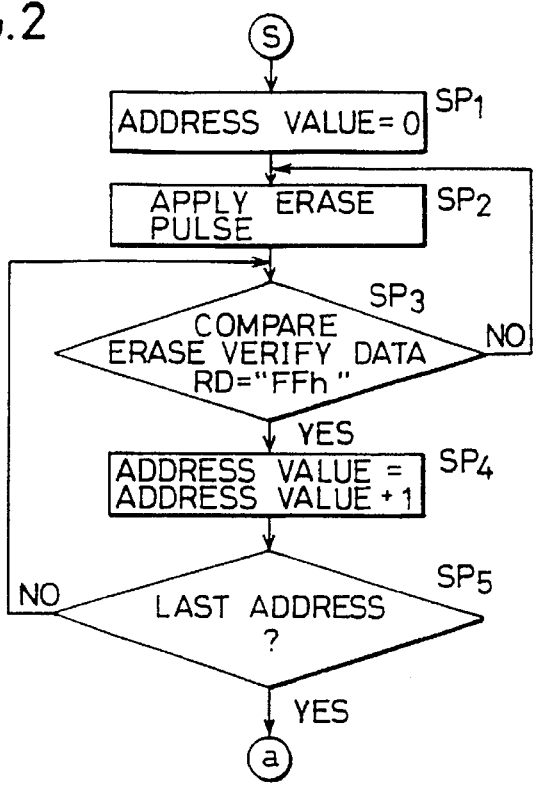
FIG. 2 is a flow chart showing erasing operation in one embodiment of the invention.
Figure 3:
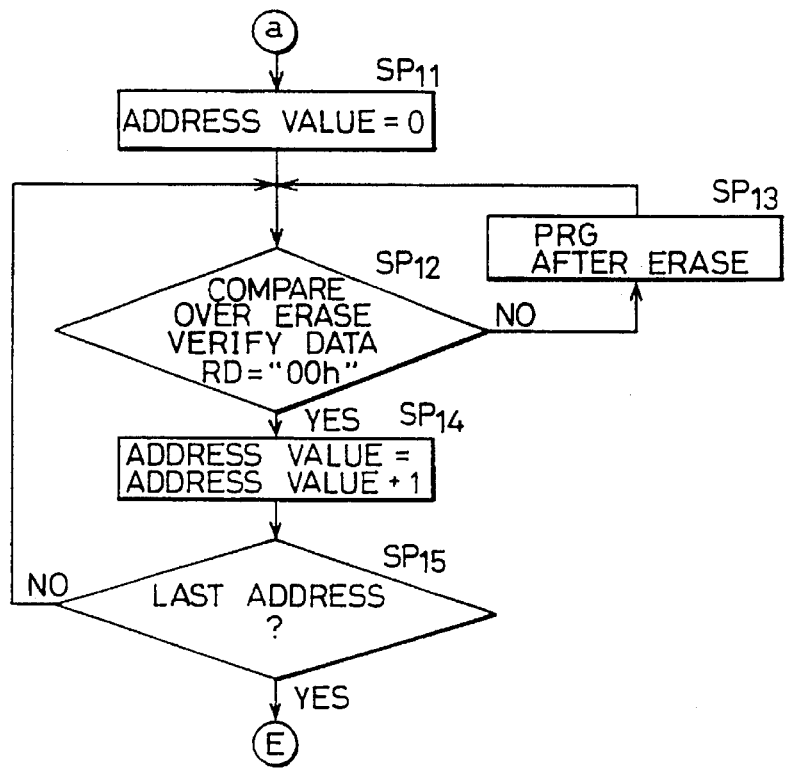
FIG. 3 is a flow chart showing write after erasure operation, in which over erased bit is detected, in accordance with one embodiment of the present invention.
Figure 4:
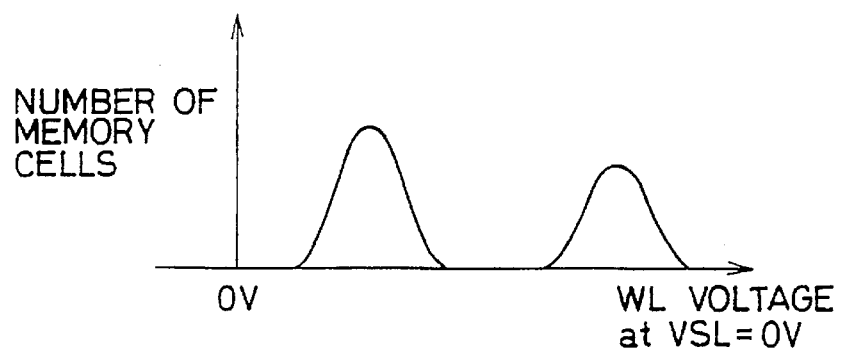
FIG. 4 shows distribution of threshold voltages of the memory cells.
Figure 5:
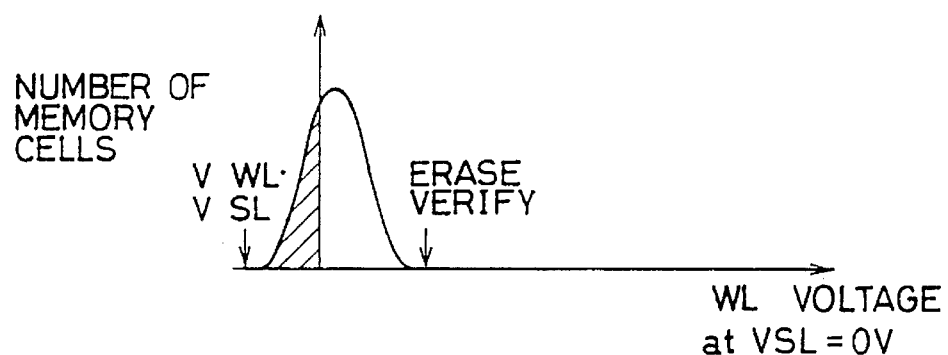
FIG. 5 is an illustration showing the cause of generation of over erased bits in the memory cells.
Figure 6:
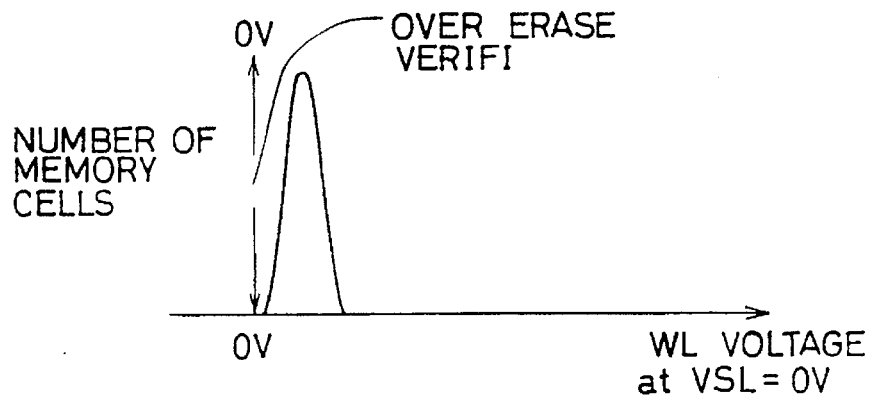
FIG. 6 shows the principle of the method of narrowing the threshold voltage distribution, in which the upper limit of the threshold is determined by erase verify, and the lower limit is free of over erasure.

FIG. 2 is a flow chart showing the erasing operation in accordance with one embodiment of the present invention. FIG. 3 is a flow chart showing the operation of writing for erasure, in which over erase bit is detected, FIG. 4 shows distribution of threshold voltages of the memory cells. FIG. 5 illustrates generation of over erased bits in the memory cells. FIG. 6 shows a method of narrowing the distribution of the threshold voltages in which the upper limit of the threshold voltage is determined by erase verify, and the lower limit is free of over erasure.

Before erasing operation, generally, the distribution of threshold voltages in the memory array is as shown in FIG. 4, that is, cells having high threshold voltages and cells having low threshold voltages are mixed. Therefore, in step SP1 (in the figure, simply denoted by SP) shown in FIG. 2, an address value is set to 0, and in step SP2, an erasure pulse is applied to all the memory cells, so that the threshold voltages of all memory cells are shifted to the erased state. This time, the erase verify voltage is set to a value lower than usual. In step SP3, erase verify data is compared to determine whether or not the read data is "FFh". If the read data is not "FFh", erasure pulse is again applied in step SP2. If the read data is "FFh", the address value is incremented by +1 in step SP4, and in step SP5, it is determined whether the address is the last address. If it is not the last address, the operations of steps SP3 and SP4 are repeated. By the operation in accordance with the flow chart of FIG. 2, the upper limit of the threshold voltage distribution becomes satisfactory as shown in FIG. 5. However, at the lower limit, there are over erased bits generated.

Therefore, operations of steps SP11 to SP15 of FIG. 3 are performed. More specifically, in step SP11, the address value is set to 0, and in step SP12, an over erase verify data is compared. Here, if the read data RD is not "00h", write after erasure is performed on the bit in step SP13. If the read data is "00h", the address value is incremented by +1 in step SP14, and in step SP15, whether it is the last address is determined. If it is not the last address, the process of step SP12 is again performed. The series of operations are effected on every memory cell. As a result, erasing operation with narrow distribution of threshold voltages becomes possible, in which the upper limit of the threshold voltages is determined by erase verify, and there is not an over erasure at the lower limit, as shown in FIG. 6.

Now, various operations related to FIG. 1 will be described. Application of the erasure pulse in step SP2 of FIG. 2 is the same as that of the prior art example. The erase verify operation in step SP3 will be described referring to memory cell 218 of FIG. 1 as an example. The node of sense amplifier 16 which has been conventionally set to the ground potential is referred to as VSAL node. The VSAL node is switched to a VPSL potential of 3 V, by the CTRL-$\overline{\text{EV}}$ signal applied to switching circuit 313 included in source line circuit 31. Switching circuit 312 switches the source potential of memory array 19 to VPSL in accordance with CTRL-$\overline{\text{ERS}}$ signal input to OR gate 311 of the source line circuit. Since the VPSL node is set to 3 V and CTRL-$\overline{\text{EV}}$ signal is set to "L" level, a potential of 3 V is applied to VSL node and VSAL node. Similarly, the node of sense amplifier 16 to which the supply voltage has been conventionally applied is used as VSAH node, to which a potential of 6 V is applied.

As described above, the node, which has been set to the ground potential of sense amplifier 16 is set to 3 V, and the node corresponding to the power supply voltage is set to 6 V. Namely, nodes 602 and 603 of sense amplifier 16 are both level shifted by 3 V. As a result, the bit line bias potential, which has been conventionally set at 1 V, is level shifted by 3 V, and hence a potential of 4 V comes to be applied to the bit line.

Figures 7, 8:
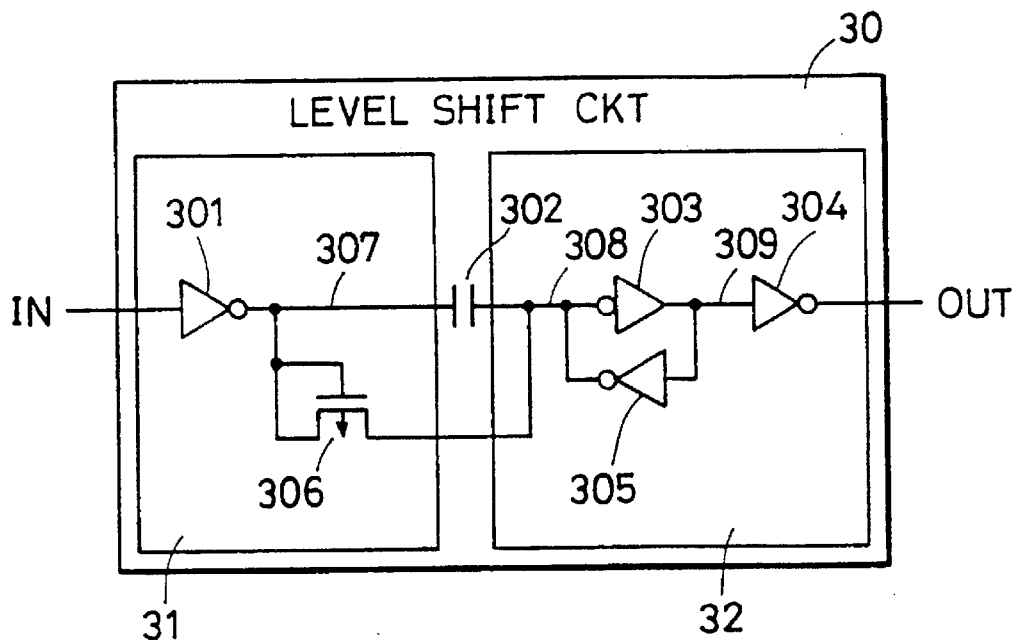
FIG. 7 shows, in a table, voltages at various portions at the time of erasure in accordance with one embodiment of the present invention.
FIG. 8 is a schematic diagram showing an example of a level shift circuit shown in FIG. 1.

FIG. 7 shows, in a table, potentials at various portions at the time of erasure, erase verify, over erase verify, write for erasure, and reading in accordance with one embodiment of the present invention. As shown in FIG. 7, the conditions are set such that 3 V is applied to source line 235 of memory array 19 of FIG. 1, 4 V is applied to selected bit line 227, 4 V is applied to the selected word line, and 0 V is applied to the non-selected word line. When the conditions of application are considered referring to the source of the memory cell, it corresponds to 0 V to the source line 235, 1 V to the selected bit line 227, 1 V to the selected word line, and −3 V to the non-selected word line (as indicated in the parentheses of FIG. 7). In other words, even if a memory cell is over erased, current does not flow from the over erased bit provided that the threshold voltage is not lower than −3 V. The potential represented by VWL-VSL shown in FIG. 5 represents the equivalent potential of the non-selected word line.

By such potential conditions, erase verify can be performed even on a memory array including over erased bits. When reading is performed and current flows through the memory cell as a result, it means that erasure of the memory cell has been completed. Meanwhile, if current does not pass through the memory cell, it means that the memory cell has not yet been erased. Therefore, according to the flow chart shown in FIG. 2, the operation of applying the erasure pulse again is repeated, and in this manner, all the memory cells are verified.

Let us consider the potential at the output node of sense amplifier 16 as in the above description. Since this node has been shifted by 3 V, in this embodiment, the "H" level corresponds to 6 V, and "L" level corresponds to 3 V. If these potentials are directly applied to a logic gate operating at the common power supply voltage in which "H" level=3 V and "L" level=0 V, both the "H" and "L" levels are determined as "H" level by the sense amplifier. Therefore, voltage level conversion is performed by the level shift circuit 30 which is connected to the output node of sense amplifier 16.

FIG. 8 is a schematic diagram showing a specific example of the level shift circuit. Referring to FIG. 8, level shift circuit 30 includes an input circuit 31 and an output circuit 32. Input circuit 31 corresponds to the output node of sense amplifier 16 shown in FIG. 1, while output circuit 32 serves as an input of a logic circuit which operates at the normal power supply voltage. Input circuit 31 includes an inverter 301 and a transistor 306, each of which operates at the power supply voltage of 6 V and the ground potential, which corresponds to 3 V. Output circuit 32 includes inverters 303 to 305, which operate at the normal power supply voltage (in which "H" level=3 V and "L" level=0 V). When an input signal IN changes from "H" level to "L" level, the input signal is inverted by inverter 301, and the level at node 307 changes from "L" level to "H" level. More specifically, node 307 changes from 3 V to 6 V. Here, the node 308 of output circuit 32 is capacitively coupled to node 307 of input circuit 31 by means of capacitor 302. By the capacitive coupling, the potential at node 308 rises (provided that node 308 is reset and at "L" level (0 V) at this time, which will be described later). To node 308, an input of inverter 303 and an output of inverter 305 are connected, and the output of inverter 303 is connected to the input of inverter 305 and to the input of inverter 304. By the rise of the potential at node 308, the node 309 changes from "H" level to "L" level. In terms of potentials, the node 309 changes from 3 V to 0 V.

Inverters 303 and 305 constitute a latch circuit, by which the change of node 307 is latched. Namely, the change from 3 V to 6 V of node 303 is transmitted as a change from 0 V to 3 V at node 308. If the potential change is transmitted and the result is latched, it appears as an amplitude of the power supply voltage at the output OUT. At this time, since transistor 306 is diode-connected and no current flows under the above mentioned voltage conditions, there is not a problem in operation.

Similarly, the change of the input signal IN from the "L" level to the "H" level can be transmitted as the amplitude of the power supply voltage to the output OUT by capacitive coupling.

In normal operation, it is necessary to provide an amplitude of the power supply voltage at sense amplifier 16. Therefore, VSAH is set to the potential of 3 V, and VSAL is set to the ground potential. It goes without saying that the sense amplifier output has the amplitude of the power supply voltage, which does not cause any problem on the operation of the level shift circuit 30. When node 307 is set to the "L" level (0 V), transistor 306 turns on and is connected to node 308. Consequently, the logics at nodes 307 and 308 match with each other, performing resetting operation.

The operation of over erase verify in the step SP12 shown in FIG. 3 will be described. As shown in over erase verify of FIG. 7, the operation is similar to that of erase verify, except that different potential is applied to the selected word line. Namely, the same potential as the source line potential is applied to the selected word line. When the voltage conditions are viewed referring to the source of the memory cell, these correspond to 0 V to the source, 1 V to the bit line, 0 V to the selected word line and −3 V to the non-selected word line. Namely, as already described, current does not flow from the memory cell on the non-selected word line. If, nevertheless, current flows when the source potential and word line potential are made equal to each other (in over erase verify of FIG. 6), it means that the memory cell has the over erased bit. In this manner, over erase verify is performed on every memory cell, and write after erasure operation, which will be described later, is performed on the over erased bit.

The operation of write after erasure in step SP13 shown in FIG. 3 will be described. As shown in FIG. 7, for write after erasure also, the source line is shifted with respect to normal writing, and accordingly the bit line potential is also shifted. However, the potential of the selected word line is set lower than in the normal writing. This is based on the characteristic that the threshold potential of the memory cell at the time of writing is shifted nearer to the gate potential, and that the threshold voltage of the memory cell never exceeds the gate potential. Specifically, when the gate potential is set about the word line potential at the time of erase verify, the shifting of the threshold voltage of the memory cell written in write after erasure stops at about the similar value, so that the distribution of the threshold voltages at the time of erasure can be narrowed, resulting in the distribution shown in FIG. 6.

As described above, according to this embodiment, by erasing operation and various operations, the distribution of the threshold voltages at the time of erasing operation can be narrowed, and the upper limit of the distribution can be lowered by the amount of narrowing. Therefore, reading can be performed with sufficient margin even in the reading operation with low voltage.

Figure 9:
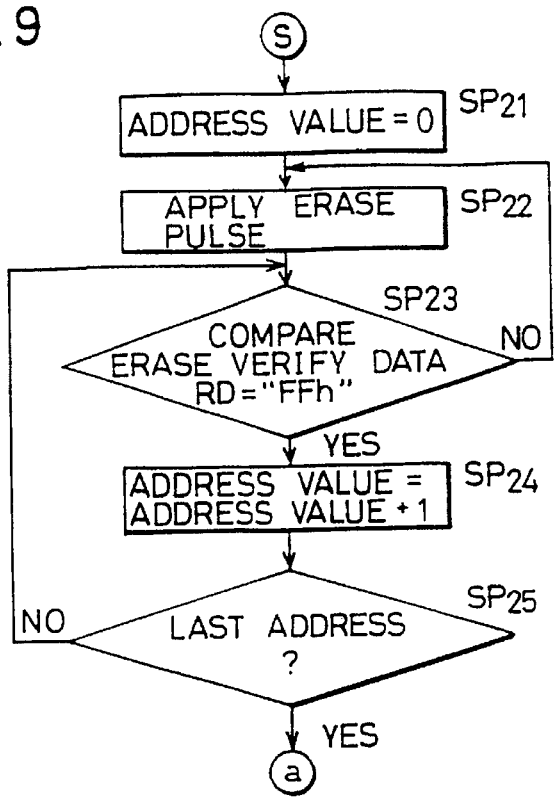
FIG. 9 is a flow chart showing erasing operation in another embodiment of the present invention.
Figure 10:
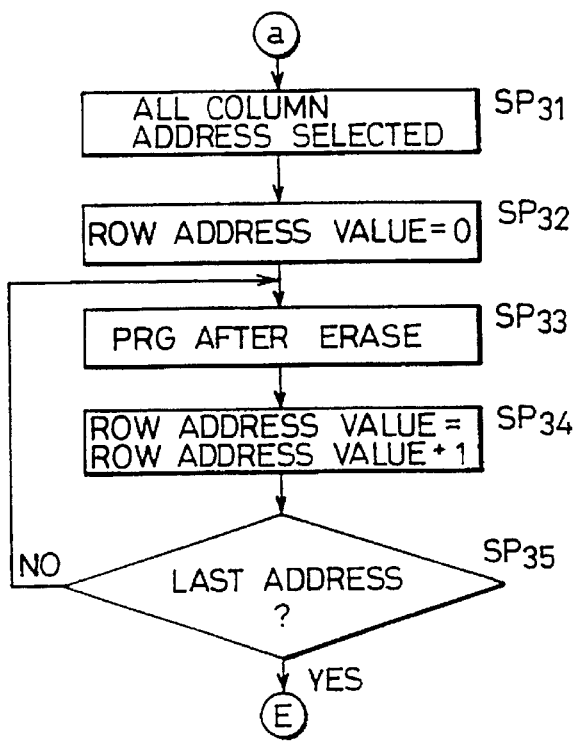
FIG. 10 is a flow chart showing the operation of write after erasure in another embodiment of the present invention.

FIGS. 9 and 10 are flow charts showing operations of another embodiment of the present invention.

The erasing operation of steps SP21 to SP25 shown in FIG. 9 are the same as steps SP1 to SP5 of FIG. 2. In step SP31 shown in FIG. 10, all column addresses are selected and all the bit lines are selected, and thereafter, in steps SP32, a row address is set to 0, the word line of row address 0 is activated, and in step SP33, write after erasure is performed. Then, in step SP34, the row address is incremented by +1, and in step SP35, it is determined whether the row address is the last row address. If it is not the last row address, the flow returns to the step SP33, operations of steps SP33 to SP35 are repeated, and write after erasure is performed word line by word line.

At this time, when the potentials are set such that the word line potential for write after erasure is shifted to a desired threshold voltage, as already described in the embodiment above, the threshold voltage does not shift exceeding the potential. Here, the aim is to carry out write after erasure without over erase verify. Therefore there is not a problem when the number of bits to which writing is effected simultaneously is set arbitrarily.

By performing erasing operation and other various operations as described above, the distribution of the threshold voltages at the time of erasing operation can be narrowed, and the upper limit of the distribution can be lowered by the narrowing. Therefore, there is a margin even at a reading operation with low voltage.

Figure 11:
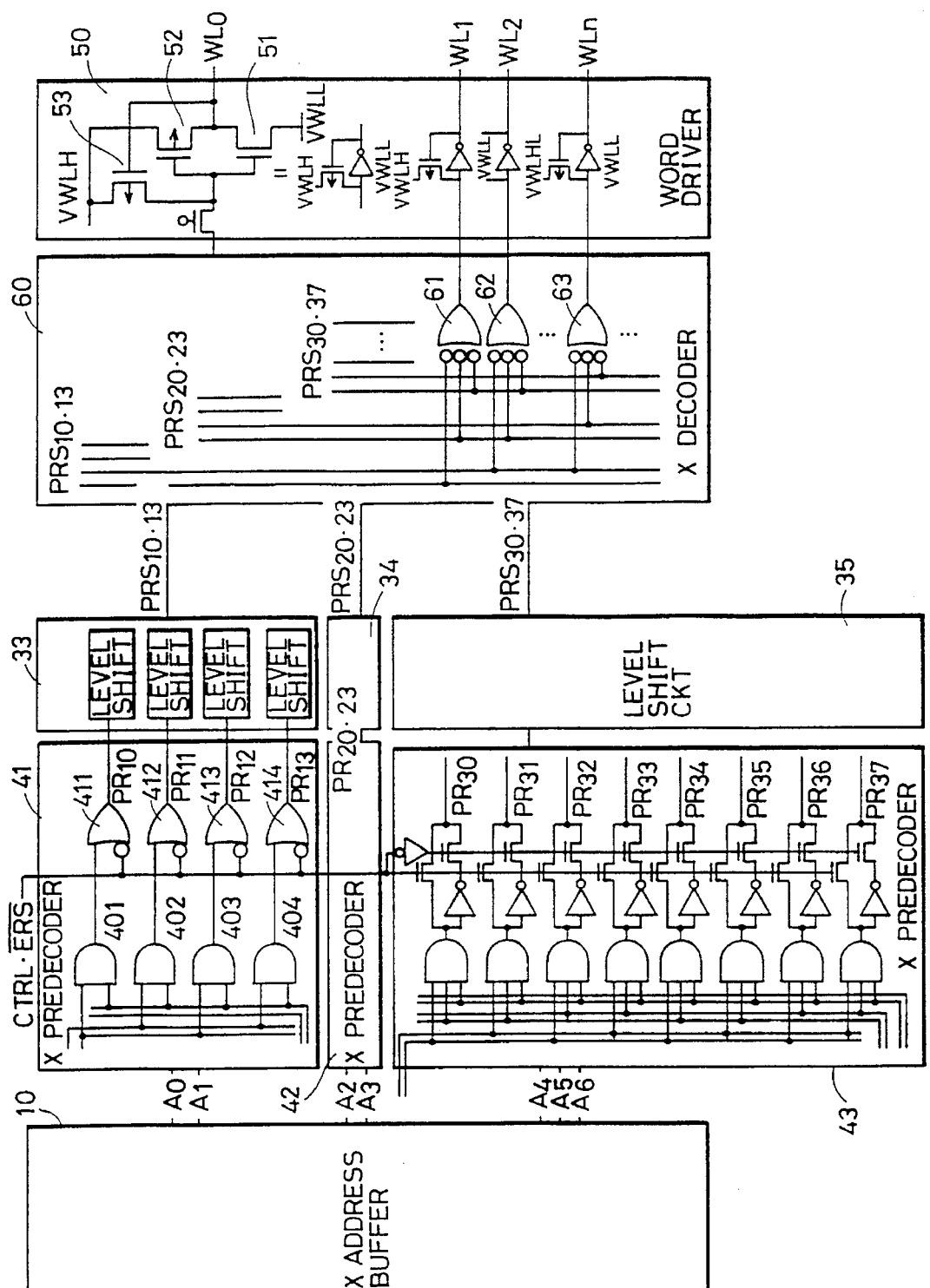
FIG. 11 is a block diagram showing a still another embodiment of the present invention.
Figure 18:
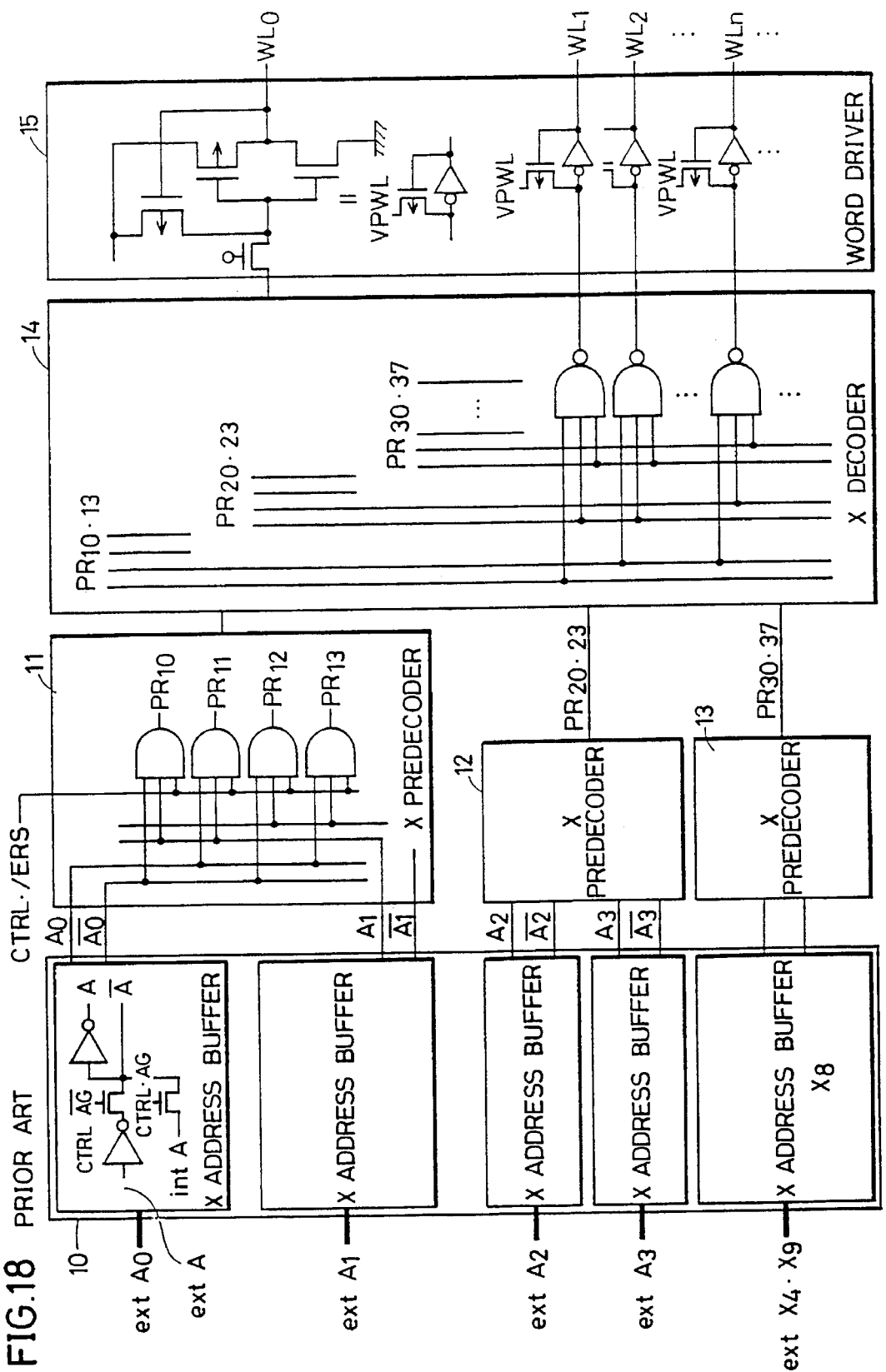
FIG. 18 shows a path for selecting a word line.
Figure 19:
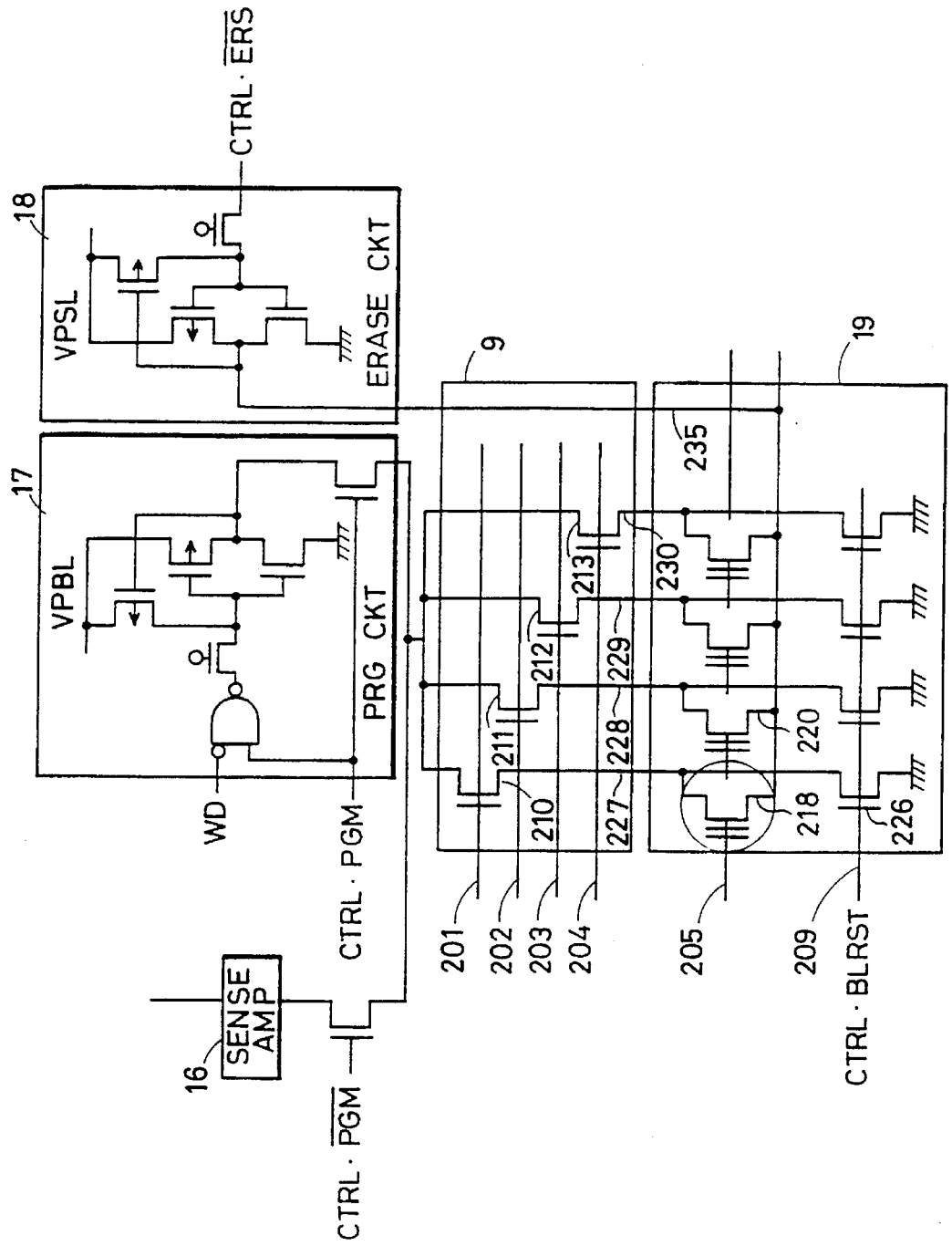
FIG. 19 shows a circuit structure extracting a part of the memory array, the Y gate, the write circuit and the erasure circuit.

FIG. 11 is a block diagram showing a still another embodiment of the present invention. This embodiment differs from the conventional example shown in FIG. 18 in the following points. Namely, in normal operation, the level of the selected word line is at the "H" level, (power supply voltage) and the level of the non-selected word line is the ground level. Therefore, when a negative voltage ("L" level) is to be applied to the selected word line, logic inversion is necessary. For this purpose, in order to set low active the output of an inverter including an n channel transistor 51 and a p channel transistor 52, word driver 50 includes a p channel transistor 53. More specifically, p channel transistor 53 has its gate connected to the output of the inverter, its drain connected to the power supply, and its source connected to the input of the inverter. Further, an X decoder 60 of the preceding stage includes 3-input NAND gates 61 to 63, to respective inputs of which any of predecode outputs PRS10 to 13, 20 to 23 and 30 to 37 are input.

An X predecoder 41 includes AND gates 401 to 404 for decoding an X address signal, and gate circuits 411 to 414 for switching between high active (when CDRL-$\overline{ERS}$="H" level) and low active (CDRL-$\overline{ERS}$="L" level) by the CTR-$\overline{ERS}$ signal. An X predecoder 42 has the same structure as X predecoder 41. An X predecoder 43 has a function of switching between high active when CTRL-$\overline{ERS}$ signal is at "H" level, and low active, when the CTRL-$\overline{ERS}$ signal is at the "L" level.

Further, level shift circuits 33, 34 and 35 are provided between X predecoders 41, 42 and 43 and X decoder 60.

Figure 12:
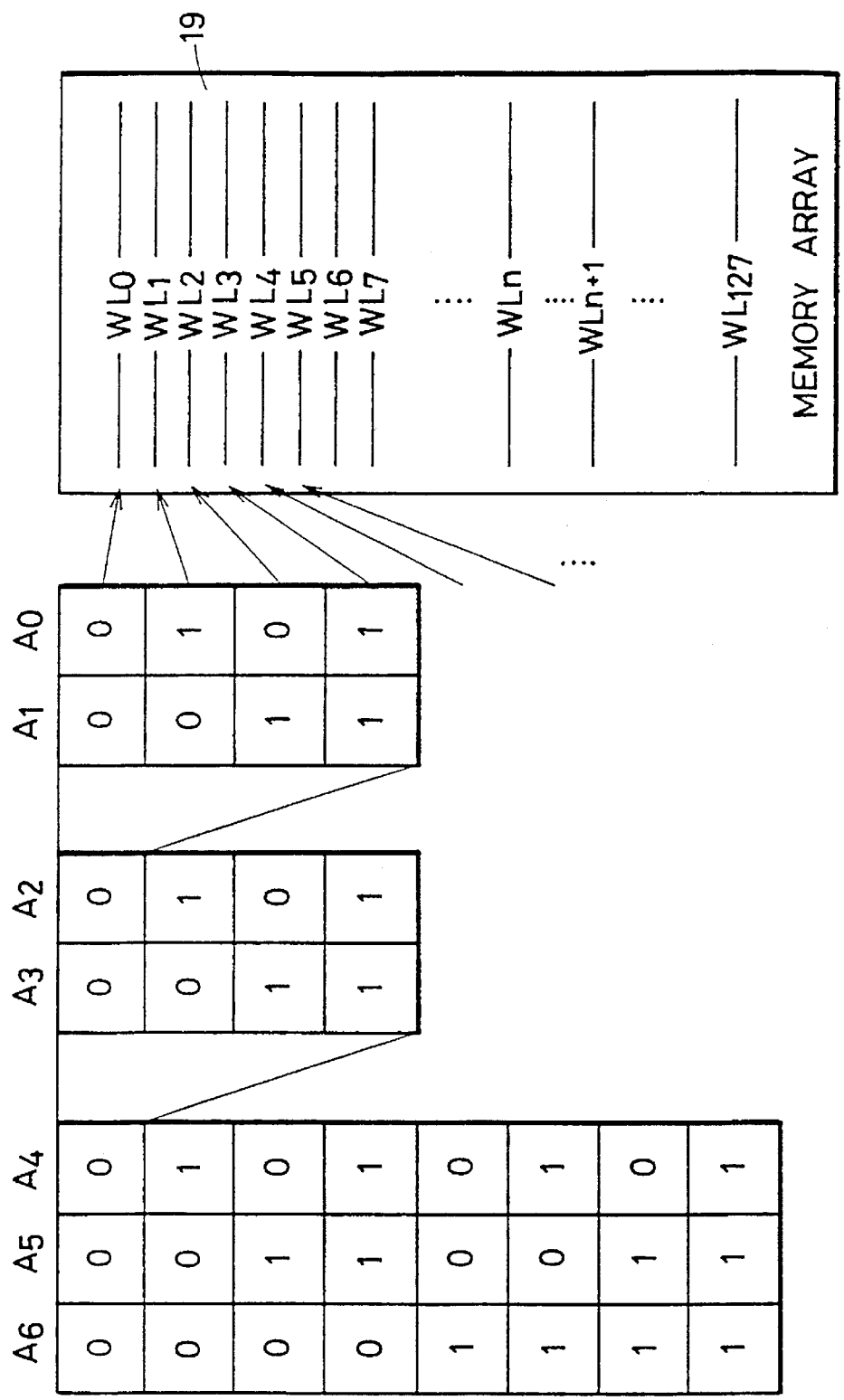
FIG. 12 shows correspondence between X address groups and word lines.
Figure 13:
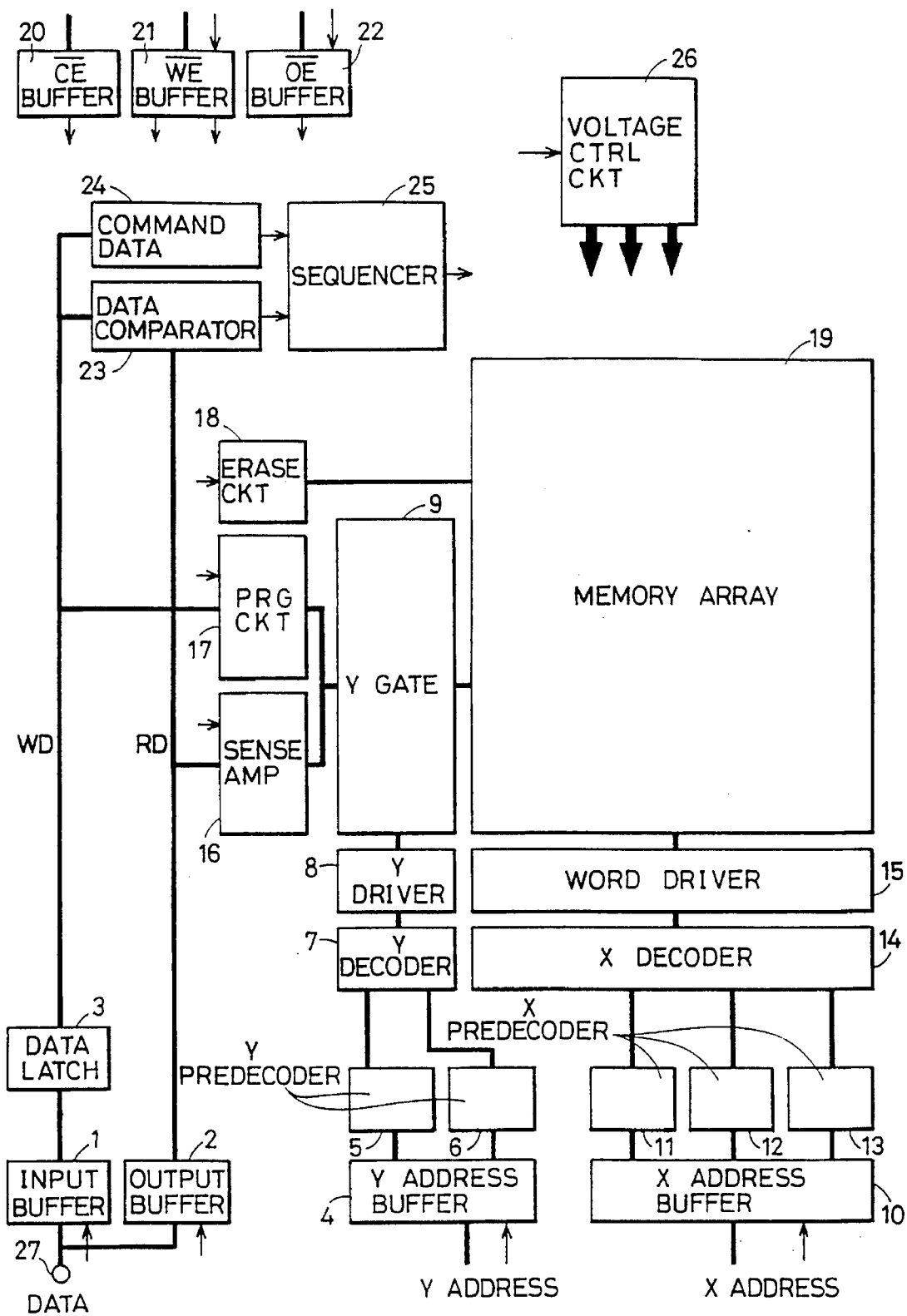
FIG. 13 is a block diagram showing the whole structure of a flash memory as an example of a conventional non-volatile memory.
Figure 14:
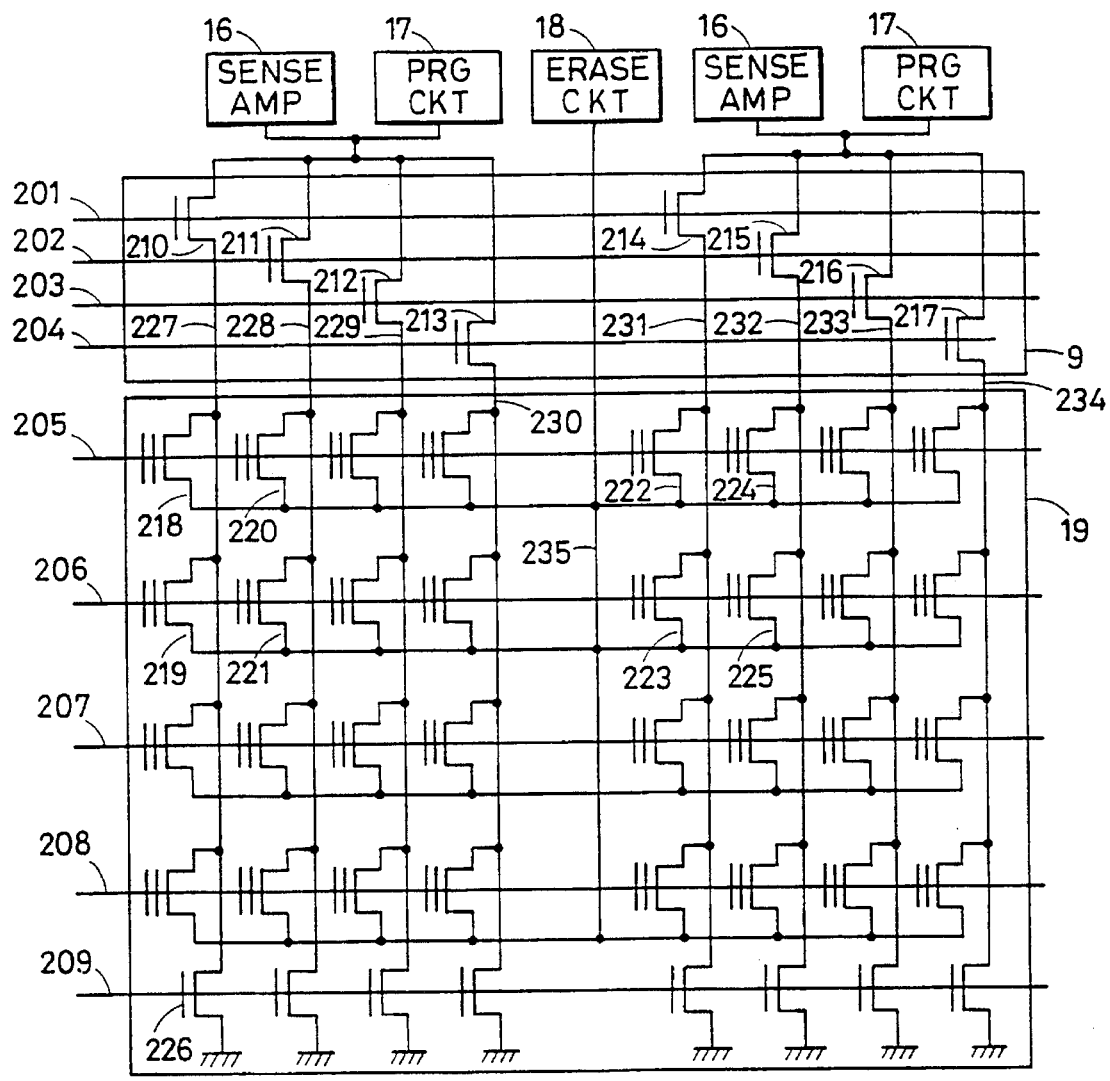
FIG. 14 shows specific structures of the Y gate and the memory array shown in FIG. 13.

FIG. 12 shows correspondence between the X address group and the word lines of FIG. 11. Referring to FIG. 12, the correspondence between the X address group and the word lines will be described. Here, it is assumed that the X address includes 7 bits. Since 128 binary numbers can be represented by 7 bits, there are a total of 128 word lines. Addresses are allotted to respective word lines. When A6-4 and A3-2 are all at the "L" level, for example, there are four combinations of A0 and A1, and therefore four word lines can be allotted (as shown by the arrows in FIG. 12). When A2 is changed to "H", since 4 combinations of A0 and A1 are possible in this case also, next four word lines (WL4-7) can be allotted. By such successive allotment, addresses can be allotted to 128 word lines. Viewed from a different aspect, the memory array is divided into 8 by using 3 bits of A6-4, and ⅛ of a memory array is selected by each address. Similarly, A3-2 further divides the ⅛ memory array selected by A6-4 into ¼, selecting one of the same. At this time, 1/32 of the whole memory array is selected. In the similar manner, A1-0 further divides the 1/32 memory array selected by A6-2 into ¼ and selects one of the resulting array, and hence selects 1/128.

In view of the foregoing, the "simultaneous selection of a plurality of word lines" mentioned before will be described. Assume that the "a signal predecoded from A1-0" and "a signal predecoded from A2-3" serve as 2 inputs of 3-input NAND gates 61–63 of X decoder 60 and the predecoded signals are all fixed at the "H" level. The signal predecoded from A6-4 serves as the remaining 1 input, only the predecode signal to be selected is set to "L" level, and other signals are set to "H" level. In other words, the predecode signal is set low active. By such setting of the signals, ⅛ of the memory cell can be selected by low active "L" level.

The operation of the X predecoders 41 and 42 for A1-0 and A3-2 will be described. When CTRL-$\overline{ERS}$ signal is set to the "L" level, all predecode signals PR10 to 13 and PR20 to 23 are set to the "H" level. X predecoders 41 and 43 select a word line low active, controlled by CTRL-$\overline{ERS}$ signal.

In order to erase only the memory cells on the selected word line, it is necessary to set the selected word line to about −10 V and to set the non-selected word line to 0 V. Accordingly, the node (VWLH) which has been conventionally set at the power supply voltage of word line driver 50 is set to 0 V, and the node (VWLL) which has been conventionally set at the ground potential is set to −10 V. Further, the node VWDH of the X decoder 60 which has been set conventionally to the power supply voltage is set to −7 V, and the node VWDL which has been set conventionally to the ground potential is set to −10 V. It goes without saying the input side of level shift circuit 33 is set to have the power supply amplitude of 3 V to 0 V, and the output side is set to have the amplitude of −7 V to −10 V, similar to the amplitude of X decoder 60. As already described, the input side and the output side of the level shift circuit 33 are connected by capacitive coupling, and therefore it operates without any problem when the voltage amplitude are set in the above described manner. By setting the potentials in this manner, the selected word line can be set to −10 V and the non-selected word line to 0 V.

Further, by setting the source line voltage to about 5 V in the similar manner as in the prior art, there is generated a high potential difference of 15 V between the selected word line-source line, while potential difference of only 5 V is generated between non-selected word line-source. Therefore, electrons are extracted only from the memory cells connected to the selected word line.

As described above, according to the present invention, only some of the memory cells of memory array 19 can be erased, and thus the unit of erasure can be made smaller.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device, comprising:

a plurality of memory cells arranged in a matrix of rows and columns, each having a control gate, a floating gate, a source and a drain, for holding information charges at said floating gate;

a plurality of bit lines provided corresponding to the columns of said memory cells and connected to the drains of the memory cells of the corresponding columns;

a plurality of word lines provided corresponding to the rows of said memory cells in a direction crossing the bit lines, and connected to control gates of the memory cells of the corresponding column;

a source line connected to the sources of said memory cells;

erasing means for extracting electrons from said floating gate;

writing means for injecting electrons to said floating gate;

first reading means for reading charge holding state of said floating gate, said first reading means setting said source line to ground potential while applying a first positive voltage to a selected word line during normal reading; and second reading means for applying a second positive voltage to said source line for reading charge holding state of said memory cell, said second reading means applying the second positive voltage to said source line while applying a third positive voltage to said selected word line, said third positive voltage being obtained by adding to the second positive voltage, a positive voltage lower than a potential difference between the voltage applied, from the first reading means, to the source line and to the selected word line.

2. The non-volatile semiconductor memory device according to claim 1, further comprising level shift means for level-shifting read output of said first reading means.

3. The non-volatile semiconductor memory device according to claim 2, wherein said level shift means includes first logic circuit operating at a first power supply voltage and said second positive voltage as ground reference potential;

a second logic circuit operating at a second power supply voltage different from said first power supply voltage and a ground potential different from said second positive voltage as ground reference potential; and capacitor element for connecting an output terminal of said first logic circuit and an input terminal of said second logic circuit.

4. The non-volatile semiconductor memory device according to claim 3, further comprising a rectifying element connected parallel to said capacitor element.

5. A non-volatile semiconductor memory device, comprising:

a plurality of memory cells arranged in a matrix of rows and columns, each having a control gate, a floating gate, a source and a drain, for holding information charges at said floating gate;

a plurality of bit lines provided corresponding to the columns of the memory cells and connected to the drains of the memory cells of the corresponding columns;

a plurality of word lines provided corresponding to the rows of said memory cells in a direction crossing the bit lines, and connected to control gates of the memory cells of the corresponding columns;

a source line connected to the sources of said memory cells;

erasing means for extracting electrons from said floating gate;

first writing means for injecting electrons to said floating gate;

reading means for reading charge holding state of said floating gates; and second writing means for applying a bias voltage to said source line for writing to said memory cell, wherein in a program after erase mode, the source line is set to a positive potential and electrons are injected to the floating gate.

6. In a non-volatile semiconductor memory device including a plurality of memory cells arranged in a matrix of rows and columns, each having a control gate, a floating gate, a source and a drain, for holding information charges at said floating gate, a plurality of bit lines provided corresponding to the columns of said memory cells and connected to the drains of the memory cells of the corresponding column, a plurality of word lines provided corresponding to the rows of said memory cells in a direction corresponding to the bit lines and connected to the control gates of the memory cells of the corresponding column, a source line connected to the sources of said memory cells, erasing means for extracting electrons from said floating gate, first writing means for injecting electrons to said floating gate, first reading means for reading charge holding state of said floating gate, second reading means for applying a positive bias voltage to said source line for reading charge holding state of said memory cell, and second writing means for applying a positive bias voltage to said source line for writing information to said memory cell, a method of erasing data stored in said memory cell, comprising:

determining, after erasing operation, whether charge holding state read by said second reading means is not larger than a first information charge amount;

when the determination is that charge holding state read by said second reading means is not larger than the first information charge amount, determining whether charges read by said second reading means is not larger than a second information charge amount, different from said first information charge amount; and when the determination is that charge holding state read by said second reading means is not larger than the second information charge amount, injecting electrons to an amount not smaller than the second information charge amount, by said second writing means.

7. In a non-volatile semiconductor memory device including a plurality of memory cells arranged in a matrix of rows and columns, each having a control gate, a floating gate, a source and a drain, for holding information charges at said floating gate, a plurality of bit lines provided corresponding to the columns of said memory cells and connected to the drains of the memory cells of the corresponding column, a plurality of word lines provided corresponding to the rows of said memory cells in a direction crossing said bit lines and connected to the control gates of the memory cells of the corresponding column, a source line connected to the sources of said memory cells, erasing means for extracting electrons from said floating gate, first writing means for injecting electrons to said floating gate, first reading means for reading charge holding state of said floating gate, second reading means for applying a positive bias voltage to said source line for reading charge holding state of said memory cell, and second writing means for applying a positive bias voltage to said source line for writing to said memory cell, a method of erasing data stored in said memory cell comprising:

determining, after erasing operation, whether charges read by said second reading means is not larger than a first information charge amount; and when the determination is that charge holding state read by said second reading means is not larger than the first information charge amount, injecting electrons to an amount not smaller than the first information charge amount by said second writing means.

* * * * *